(12) United States Patent
Seki et al.

(10) Patent No.: US 11,678,508 B2
(45) Date of Patent: Jun. 13, 2023

(54) DISPLAY AND ELECTRONIC APPARATUS

(71) Applicant: JOLED INC., Tokyo (JP)

(72) Inventors: Takahiro Seki, Tokyo (JP); Katsumasa Yamazaki, Tokyo (JP)

(73) Assignee: JOLED INC., Tokyo (JP)

( * ) Notice: Subject to any disclaimer, the term of this patent is extended or adjusted under 35 U.S.C. 154(b) by 117 days.

(21) Appl. No.: 17/201,573

(22) Filed: Mar. 15, 2021

(65) Prior Publication Data

US 2021/0288287 A1   Sep. 16, 2021

(30) Foreign Application Priority Data

Mar. 16, 2020 (JP) .............................. JP2020-045591

(51) Int. Cl.
*G06F 3/147* (2006.01)
*H10K 50/844* (2023.01)

(52) U.S. Cl.
CPC ........... *H10K 50/844* (2023.02); *G06F 3/147* (2013.01)

(58) Field of Classification Search
CPC ....................................................... G06F 3/147
See application file for complete search history.

(56) References Cited

U.S. PATENT DOCUMENTS

2018/0046220 A1   2/2018   Kim et al.
2020/0044170 A1   2/2020   Seki et al.

FOREIGN PATENT DOCUMENTS

| CN | 108475084 | 8/2018 |
| CN | 110782785 | 2/2020 |
| EP | 3716005 | 9/2020 |
| JP | 2018-024567 | 2/2018 |

*Primary Examiner* — Gustavo Polo
(74) *Attorney, Agent, or Firm* — Greenblum & Bernstein, P.L.C.

(57) ABSTRACT

A display includes a display panel, a shock dispersion layer, a strain relaxation layer, and a shock absorption layer. The shock dispersion layer is provided on a light-extraction side of the display panel and has a Young's modulus of 50 GPa or greater. The strain relaxation layer is provided between the shock dispersion layer and the display panel and has a Young's modulus lower than the Young's modulus of the shock dispersion layer. The shock absorption layer is provided between the strain relaxation layer and the display panel and has a storage modulus of 10 kPa or greater and 1 MPa or less at a room temperature.

14 Claims, 4 Drawing Sheets

DISPLAY AND ELECTRONIC APPARATUS

CROSS REFERENCE TO RELATED APPLICATIONS

This application claims the benefit of Japanese Priority Patent Application No. 2020-045591 filed on Mar. 16, 2020, the entire contents of which are incorporated herein by reference.

BACKGROUND

The technology relates to a display and an electronic apparatus including the display.

Development in flexible displays has been developed. Flexible displays are characterized by their thinness, lightness, and flexibility. To enhance the mechanical strength of such a flexible display against external shock, a protective sheet has been provided on the display surface, as disclosed in Japanese Unexamined Patent Application Publication No. 2018-24567, for example.

SUMMARY

A display according to one embodiment of the disclosure includes a display panel, a shock dispersion layer, a strain relaxation layer, and a shock absorption layer. The shock dispersion layer is provided on a light-extraction side of the display panel and has a Young's modulus of 50 GPa or greater. The strain relaxation layer is provided between the shock dispersion layer and the display panel and has a Young's modulus lower than the Young's modulus of the shock dispersion layer. The shock absorption layer is provided between the strain relaxation layer and the display panel and has a storage modulus of 10 kPa or greater and 1 MPa or less at a room temperature.

A display according to one embodiment of the disclosure includes a display panel, a shock dispersion layer, a strain relaxation layer, a gel-like shock absorption layer, and a first minimum-strain face. The shock dispersion layer is provided on a light-extraction side of the display panel and has a Young's modulus of 50 GPa or greater. The strain relaxation layer is provided between the shock dispersion layer and the display panel and has a Young's modulus lower than the Young's modulus of the shock dispersion layer. The gel-like shock absorption layer is provided between the strain relaxation layer and the display panel. The first minimum-strain face is provided in the display panel and at which a strain generated when the display is folded is minimum.

An electronic apparatus according to one embodiment of the disclosure includes a display. The display includes a display panel, a shock dispersion layer, a strain relaxation layer, and a shock absorption layer. The shock dispersion layer is provided on a light-extraction side of the display panel and has a Young's modulus of 50 GPa or greater. The strain relaxation layer is provided between the shock dispersion layer and the display panel and has a Young's modulus lower than the Young's modulus of the shock dispersion layer. The shock absorption layer is provided between the strain relaxation layer and the display panel and has a storage modulus of 10 kPa or greater and 1 MPa or less at a room temperature.

An electronic apparatus according to one embodiment of the disclosure includes a display. The display includes a display panel, a shock dispersion layer, a strain relaxation layer, a gel-like shock absorption layer, and a first minimum-strain face. The shock dispersion layer is provided on a light-extraction side of the display panel and has a Young's modulus of 50 GPa or greater. The strain relaxation layer is provided between the shock dispersion layer and the display panel and has a Young's modulus lower than the Young's modulus of the shock dispersion layer. The gel-like shock absorption layer is provided between the strain relaxation layer and the display panel. The first minimum-strain face is provided in the display panel and at which a strain generated when the display is folded is minimum.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the disclosure.

DETAILED DESCRIPTION

It has been desired to suppress a decrease in flexibility of a display provided with a protective sheet.

It is desirable to provide a display that makes it possible to suppress a decrease in flexibility and an electronic apparatus including such a display.

Some example embodiments of the technology will now be described with reference to the accompanying drawings. Note that the description is given in the following order.
1. Embodiments (Example of Display Including Protective Sheet on Light-Extraction Face of Display Panel)
2. Modification Example (Example of Display Including Protective Member on Face Opposite to Light-Extraction Face of Display Panel)
3 First Application Example (Display)
4. Second Application Example (Electronic apparatus)

1. Embodiments

[Configuration]

Figure 1:
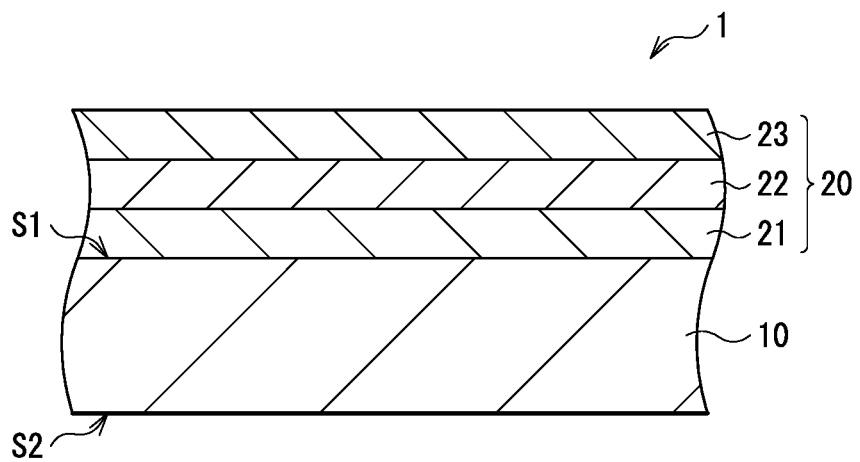
FIG. 1 is a schematic cross-sectional view of a display according to one example embodiment of the technology.

FIG. 1 schematically illustrates an exemplary cross-sectional configuration of a display 1 according to an example embodiment of the disclosure. The display 1 may be applied to a foldable display or a flexible display, for example. The display 1 includes a display panel 10 and a protective sheet 20. The display panel 10 may have a first surface S1 and a second surface S2. The first surface S1 of the display panel 10 may be a light-extraction surface, and the second surface S2 may be a surface opposite to the first surface S1. The protective sheet 20 is provided on the first surface S1 of the display panel 10. The protective sheet 20 includes a shock absorption layer 21, a strain relaxation layer 22, and a shock dispersion layer 23 in order from the first surface S1 of the display panel 10. For example, the display 1 may include a controller that controls the display panel 10, and the display panel 10 may be controlled on the basis of control signals transmitted from the controller. When receiving the control signal, the display panel 10 may generate image light, which will be extracted to the outside through the first surface S1 and the protective sheet 20.

[Display Panel 10]

Figure 2:
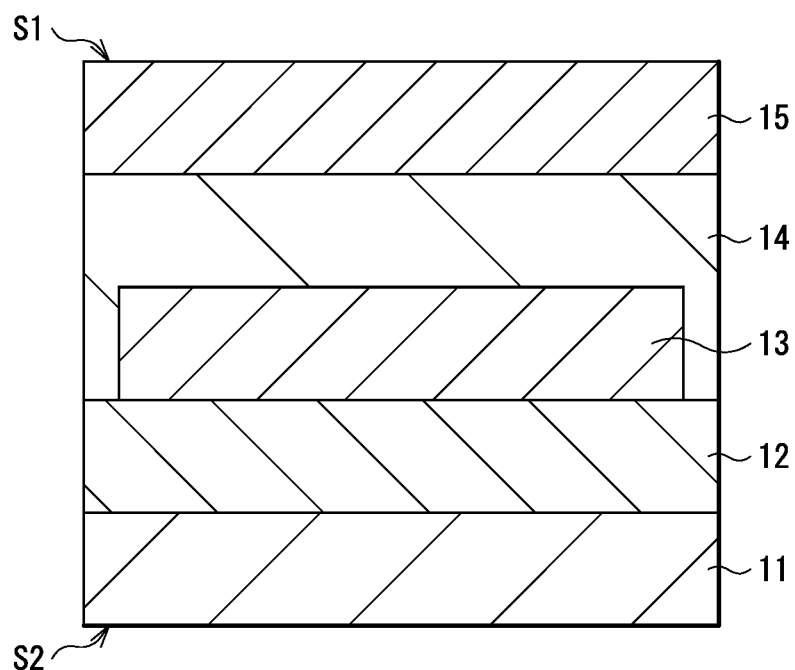
FIG. 2 is a schematic cross-sectional view of a display panel of the display illustrated in FIG. 1.

FIG. 2 schematically illustrates an exemplary cross-sectional configuration of the display panel 10. The display panel 10 may be a top-emission organic electroluminescent (EL) panel, for example. The display panel 10 may include, in order, a substrate 11, an undercoat (UC) film 12, a display element layer 13, a sealing film 14, and a polarization plate 15. The first surface S1 of the display panel 10 may be provided adjacent to the polarization plate 15, and the second surface S2 of the display panel 10 may be provided adjacent to the substrate 11. The display panel 10 may have flexibility, for example.

The substrate 11 may be a flexible substrate including a resin material such as polyimide (PI), for example. Alternatively, the substrate 11 may include a glass or metal material, for example. Specific but non-limiting examples of the resin material of the substrate 11 may include polymethylmethacrylate (PMMA), polyvinyl alcohol (PVA), polyvinyl phenol (PVP), polyether sulfone (PES), polycarbonate (PC), polyethylene terephthalate (PET), or triacetylcellulose (TAC). The substrate 11 may be a film or sheet.

The UC film 12 provided between the substrate 11 and the display element layer 13 may suppress migration of substances such as sodium ions from the substrate 11 to an upper layer such as the display element layer 13. The UC film 12 may include an insulating material such as silicon nitride (SiN) or silicon oxide (SiO). For example, the UC film 12 may be a multi-layered film including a silicon nitride (SiN) film and a silicon oxide (SiO) film in order from the substrate 11. The UC film 12 may extend over the entire surface of the substrate 11, for example.

Non-illustrated thin-film transistors (TFT) may be provided between the UC film 12 and the display element layer 13, for example. The TFTs may be top-gate TFTs, bottom-gate TFTs, or dual-gate TFTs, for example. The TFTs may include a semiconductor layer in a selective region of the substrate 11. The semiconductor layer may include a channel region serving as an active layer. The semiconductor layer may include an oxide semiconductor that includes at least one oxide of indium (In), gallium (Ga), zinc (Zn), tin (Sn), titanium (Ti), or niobium (Nb), for example. Specific but non-limiting examples of the oxide semiconductor may include indium tin zinc oxide (ITZO), indium gallium zinc oxide (IGZO:InGaZnO), zinc oxide (ZnO), indium zinc oxide (IZO), indium gallium oxide (IGO), indium tin oxide (ITO), and indium oxide (InO). Alternatively, the semiconductor layer may include a low-temperature polycrystalline silicon (LTPS) or amorphous silicon (a-Si), for example.

The display element layer 13 provided between the substrate 11 and the polarization plate 15 may include multiple pixels and an organic electroluminescent (EL) element driven by a back plane provided with the TFTs to display an image. The organic electroluminescent element may include an anode electrode, an organic layer including a light-emitting layer, and a cathode electrode in order from the UC film 12. The anode electrode may be coupled to a source-drain electrode of the TFT, for example. The cathode electrode may be supplied with a cathode potential common to the pixels via a wiring line, for example. Optionally, the organic EL element may include a hole injection layer and a hole transport layer in order from the anode electrode between the anode electrode and the light-emitting layer. The organic EL element may include an electron injection layer and an electron transport layer in order from the cathode electrode between the cathode electrode and the light-emitting layer.

The sealing film 14 provided on the display element layer 13 may cover an end portion of the display element layer 13 so as to be in contact with the UC film 12. That is, the display element layer 13 may be sealed between the sealing film 14 and the substrate 11. The sealing film 14 may help prevent moisture from entering from the outside into the display element layer 13. The sealing film 14 may include an inorganic material, such as silicon oxide ($SiO_x$), silicon nitride ($SiN_x$), silicon nitride oxide (SiON), or aluminum oxide (AlO). The sealing film 14 may include three or more layers each including the organic or inorganic material described above and alternately laminated.

The polarization plate 15 provided on the sealing film 14 may be opposite to the substrate 11 across the display element layer 13. For example, the polarization plate 15 may be a circularly polarizing plate that suppresses reflection of external light incident on the display panel 10.

[Protective Sheet 20]

The protective sheet 20 may protect the first surface S1 of the display panel 10. The protective sheet 20 that includes the shock absorption layer 21, the strain relaxation layer 22, and the shock dispersion layer 23 described later enhances the excoriation resistance and the shock resistance of the display 1.

The shock dispersion layer 23 of the protective sheet 20 may be provided at a position farthest from the first surface S1 of the display panel 10 in the protective sheet 20, for example. The shock dispersion layer 23 may disperse external shock applied to the display 1 so that the external shock will not focus on one point of the display 1. The shock dispersion layer 23 may also prevent the display 1 from being damaged by scratching, for example. The shock dispersion layer 23 has a Young's modulus of 50 GPa, for example. The shock dispersion layer 23 may have Young's modulus of 60 GPa to 70 GPa, for example. The shock dispersion layer 23 may include a flexible reinforced glass, for example. For example, the shock dispersion layer 23 may include a reinforced glass having a thickness of 30 μm or greater and 100 μm or less, for example.

The strain relaxation layer 22 provided between the shock dispersion layer 23 and the shock absorption layer 21 may enhance the cracking resistance of the shock dispersion layer 23 against a load. The strain relaxation layer 22 has a Young's modulus lower than the shock dispersion layer 23. For example, the strain relaxation layer 22 may have a Young's modulus of 1 GPa or greater and 10 GPa or less. In a case where the shock dispersion layer 23 is a member with high bending resistance but the shock absorption layer 21 provided below the shock dispersion layer 23 is a very soft layer, the shock dispersion layer 23 can be greatly deflected and cracked beyond the bending fracture stress by a load. The strain relaxation layer 22 provided between the shock dispersion layer 23 and the shock absorption layer 21 thus enhances the cracking resistance of the shock dispersion layer 23 against a load.

The strain relaxation layer 22 may be a transparent curable resin layer having a bending strength and a tensile strength greater than those of the shock dispersion layer 23, for example. The transparent curable resin layer may be a wet laminate member or a dry laminate member in close contact with the shock dispersion layer 23, for example. The wet laminate member may be formed by curing an energy curable resin, such as a UV curable resin, applied on the shock dispersion layer 23, for example. The dry laminate member may be formed by attaching a resin film to the shock dispersion layer 23, for example.

The strain relaxation layer 22 may have a thickness of 10 μm or greater and 100 μm or less, for example. The strain relaxation layer 22 having a thickness of 10 μm or greater may cover the finely uneven surface of the shock dispersion layer 23 more effectively. The strain relaxation layer 22 having a thickness of 100 μm or less may maintain the flexibility of the protective sheet 20 more effectively.

The shock absorption layer 21 provided between the strain relaxation layer 22 and the first surface S1 of the display panel 10 may be a gel-like layer. When the shock dispersion layer 23 receives a shock, the shock absorption layer 21 may deform conforming to the shock dispersion layer 23 curved by the shock. The shock absorption layer 21 may thereby absorb the shock applied to the shock dispersion layer 23 and reduce an effect of the shock on the display panel 10.

In the present example embodiment, the gel-like shock absorption layer 21 has a storage modulus of 10 kPa or greater and 1 MPa or less at a room temperature. Thus, a minimum-strain face (corresponding to a minimum-strain face λ2 illustrated in FIG. 5 described later) at which the strain generated upon folding the display 1 is minimum may be formed on the display panel 10, which will be described in detail later. Accordingly, it is possible to reduce the stress applied to the display panel 10 when the display 1 is bent.

The shock absorption layer 21 may have a storage modulus of 100 kPa or less at the room temperature, for example. This further reduces the stress applied to the display panel 10. Further, the shock absorption layer 21 having the storage modulus of 10 kPa or greater at the room temperature exhibits higher shock absorptivity. Herein, the room temperature may be 15° C. or greater and 35° C. or less. The storage modulus may be measured by a rotary rheometer, for example.

The shock absorption layer 21 may have a rubber hardness of 17 or greater and 30 or less, or 17 or greater and 24 or less, for example. This maintains the shock resistance of the protective sheet 20 more effectively (refer to FIG. 6 described later). The rubber hardness may be measured by a durometer ASTM D 2240, type 00.

The shock absorption layer 21 may be a gel-like resin layer, for example. The shock absorption layer 21 may include a gel-like adhesive, for example. The shock absorption layer 21 may also serve to attach the protective sheet 20 directly or indirectly to the first surface S1 of the display panel 10. The shock absorption layer 21 may include a gel-like acrylic adhesive, for example. Alternatively, the shock absorption layer 21 may include another gel-like adhesive such as silicon gel. The shock absorption layer 21 may have a thickness of 100 μm or greater and 500 μm or less.

[Operation]

In the display 1, the pixels in the display element layer 13 may be driven to display an image in response to an external image signal. At this time, the TFT may be driven by voltage for each pixel, for example. For example, when a voltage greater than or equal to a threshold voltage is applied to the TFT, the semiconductor layer described above may be activated (a channel is formed), generating an electric current flowing between the paired source-drain electrodes of the thin-film transistor. The display panel 10 may achieve image displaying by utilizing such voltage driving of the TFTs. Image light generated by the display panel 10 may be extracted from the first surface S1 via the protective sheet 20 to the outside.

[Workings and Effects]

The display 1 according to the present example embodiment includes the shock absorption layer 21 having a storage modulus of 10 kPa or greater and 1 MPa or less at the room temperature. This facilitates formation of the minimum-strain face—at which the strain generated upon folding the display 1—in the display panel 10. The workings and effects of the display 1 according to the example embodiment will now be described in detail comparing with a comparative example.

Figure 3:
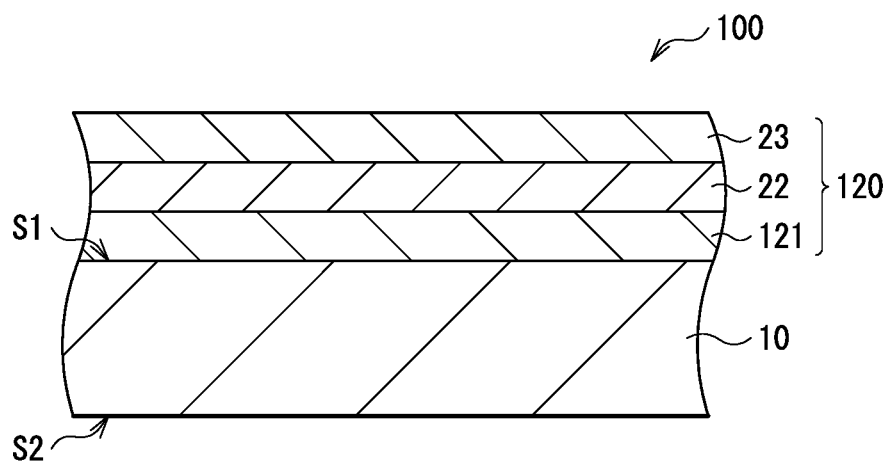
FIG. 3 is a schematic cross-sectional view of a display according to a comparative example.

FIG. 3 illustrates a schematic cross-sectional configuration of a display 100 according to a comparative example. The display 100 includes the display panel 10 and a protective sheet 120 provided on the first surface S1 of the display panel 10. The protective sheet 120 includes a shock absorption layer 121, the strain relaxation layer 22, and the shock dispersion layer 23 in order from the first surface S1 of the display panel 10. The protective sheet 120 has a storage modulus of 10 MPa at the room temperature. That is, the shock absorption layer 121 has a storage modulus greater than 1 MPa at the room temperature. The protective sheet 120 of the display 100 is different from the protective sheet 20 of the display 1 in this regard.

Figure 4:
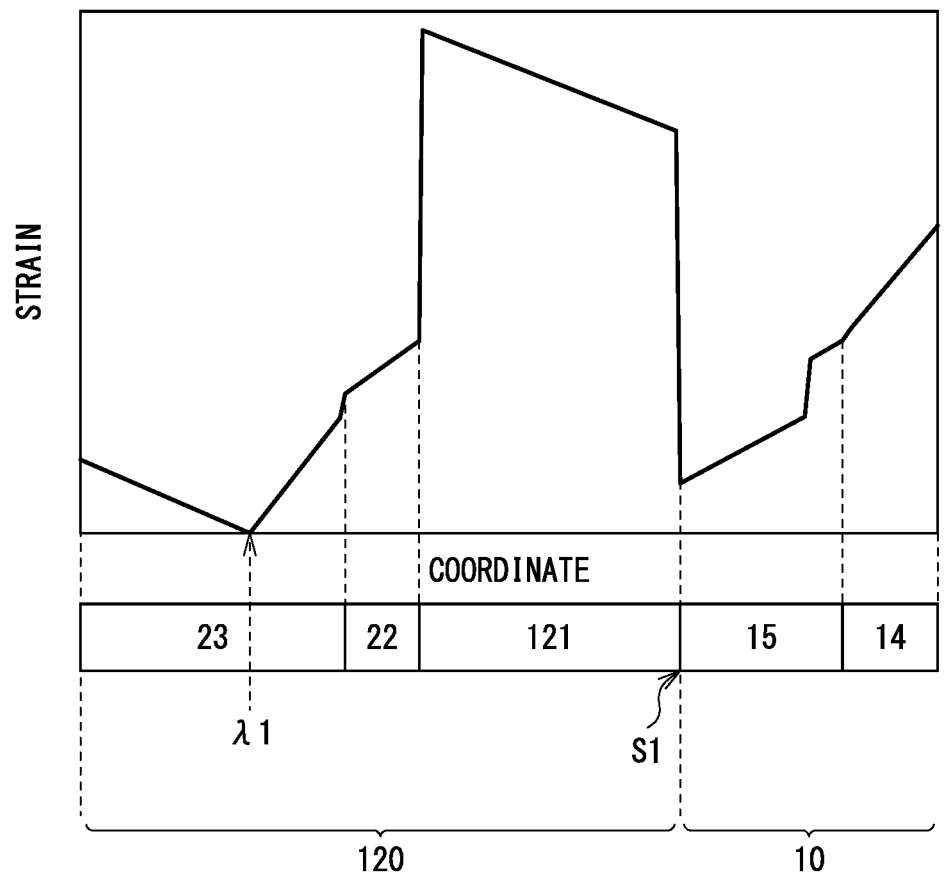
FIG. 4 is a diagram illustrating the magnitude of strain generated when the display illustrated in FIG. 3 is folded.

FIG. 4 illustrates the relation between the magnitude of strain generated upon folding the display 100 and the position or coordinate of the strain in the laminated direction obtained through a simulation. The simulation was conducted using structure analysis software based on a finite element method analysis. Tables 1 below illustrates the conditions of the simulation. The shock absorption layer 121 was a super-elastic model having a thickness of 100 μm and an elastic modulus of 0.01 GPa (10 MPa). The strain relaxation layer 22 was an elasto-plastic model having a thickness of 30 μm and an elastic modulus 3 GPa. The shock dispersion layer 23 was an elastic model having a thickness of 100 μm and an elastic modulus of 70 GPa. The sealing film 14 was an elasto-plastic model having a thickness of 65 μm and an elastic modulus 6 GPa. The substrate 11 to the display element layer 13 were each an elastic model having a thickness of 40 μm and an elastic modulus 10 GPa.

TABLE 1

| Member | Thickness (μm) | Elastic modulus (GPa) | Material model |
| --- | --- | --- | --- |
| Shock absorption layer 121 | 100 | 0.01 | Super-elastic model |
| Strain relaxation layer 22 | 30 | 3 | Elasto-plastic model |
| Shock dispersion layer 23 | 100 | 70 | Elastic model |

TABLE 1-continued

| Member | Thickness (μm) | Elastic modulus (GPa) | Material model |
|---|---|---|---|
| Sealing film 14 | 65 | 6 | Elasto-plastic model |
| Substrate 11 to Display element layer 13 | 40 | 10 | Elastic Model |

FIG. 4 demonstrates that a minimum-strain face λ1 at which a strain generated upon folding the display 100 was minimum was present in the shock dispersion layer 23. That is, the minimum-strain face λ1 was formed in the shock dispersion layer 23 having a high Young's modulus by using the shock absorption layer 121 having a high storage modulus. The strain generated at the minimum-strain face λ1 upon folding the display 100 was substantially 0 (zero).

The shock dispersion layer 23 may have a Young's modulus of about 60 GPa to 70 GPa, for example. The Young's modulus of the shock dispersion layer 23 may be one or several orders of magnitude greater than the Young's modulus of the strain relaxation layer 22 and the shock absorption layer 121. The magnitude of the Young's modulus of the shock dispersion layer 23 greatly influenced the position of the minimum-strain face λ1, forming the minimum-strain face λ1 in the shock dispersion layer 23, as illustrated in FIG. 4. In the display 100, the display panel 10 is remote from the minimum-strain face λ1. Thus, a larger stress can be applied to the display panel 10.

Folding the display 100 in a small curvature radius R applies a large stress to the display panel 10 remote from the minimum-strain face λ1. The stress can damage the TFTs, the display element layer 13, and the sealing film 14, for example.

In contrast, in the display 1 according to the present example embodiment, the shock absorption layer 21 has a storage modulus of 10 kPa or greater and 1 MPa or less at the room temperature. This facilitates formation of the minimum-strain face also in the display panel 10.

Figure 5:
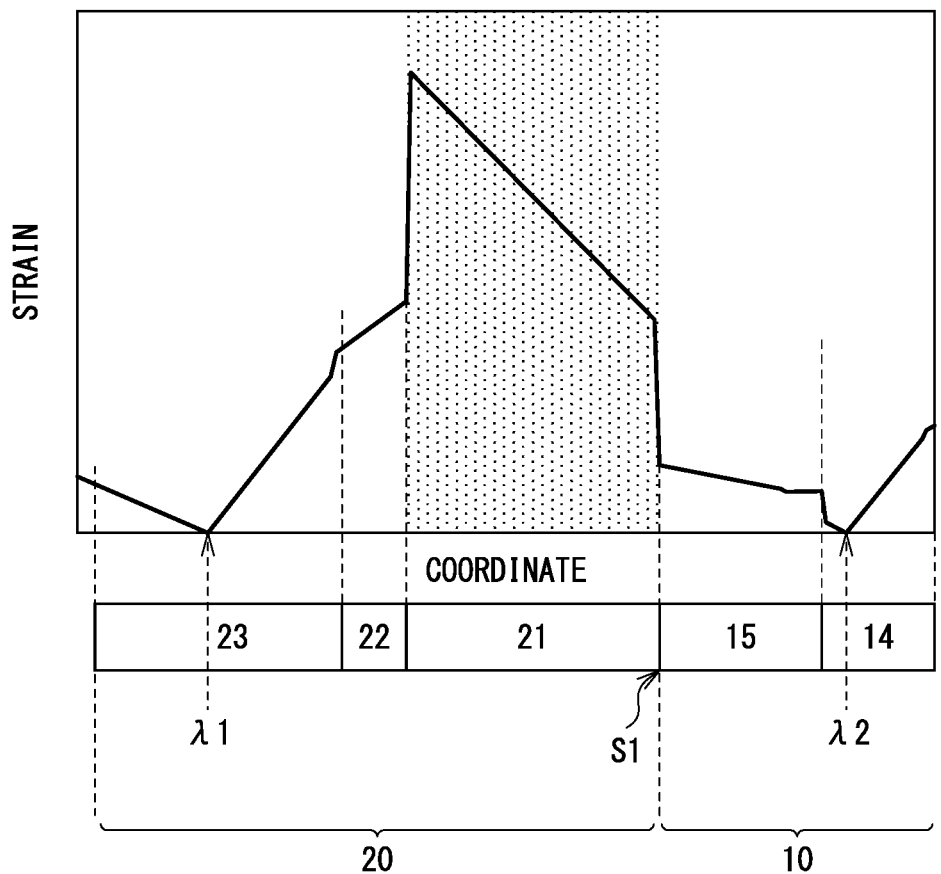
FIG. 5 is a diagram illustrating the magnitude of strain generated when the display illustrated in FIG. 1 is folded.

FIG. 5 illustrates the relation between the magnitude of strain generated upon folding the display 1 and the position or coordinate of the strain in the laminated direction obtained through a simulation. The simulation was conducted based on the same conditions as those for the simulation of the display 100 illustrated in FIG. 4 except the storage modulus of the shock absorption layer 21. In the simulation illustrated in FIG. 5, the storage modulus of the shock absorption layer 21 was 30 kPa.

As illustrated in FIG. 5, the shock absorption layer 21 having a low storage modulus relaxed the stress, forming an additional minimum-strain face (hereinafter referred to as a minimum-strain face λ2) in the display panel 10. That is, in the display 1, the minimum-strain face λ1 was formed in the shock dispersion layer 23, and the minimum-strain face λ2 opposite to the minimum-strain face λ1 across the shock absorption layer 21 was formed in the display panel 10. The strain generated at the minimum-strain face λ2 upon folding the display 1 was substantially 0 (zero). However, a small strain may be generated at the minimum-strain face λ2 as long as the effects of the disclosure are obtained. The presence of the minimum-strain face λ2 in the display panel 10 of the display 1 reduces the stress applied to the TFTs, the display element layer 13, and the sealing film 14 of the display panel 10, for example, compared with the display 100. This reduces the damage on the display panel 10 generated when the display 1 is folded in a small curvature radius. In one embodiment, the minimum-strain face λ2 corresponds to a specific but non-limiting example of a first minimum-strain face. In one embodiment, the minimum-strain face λ1 corresponds to a specific but non-limiting example of a second minimum-strain face.

The shock absorption layer 21 may have a rubber hardness of 17 or greater and 30 or less, for example. This maintains the shock resistance of the protective sheet 20 more effectively. The shock resistance of the protective sheet 20 will now be described.

As described above, the shock absorption layer 21 of the protective sheet 20 has a storage modulus of 10 kPa or greater and 1 MPa or less at the room temperature. This reduces the stress applied to the display panel 10 generated when the display 1 is folded. However, as the storage modulus of the shock absorption layer 21 decreases, the shock absorption layer becomes more likely to be crashed by an external shock. This can hinder the shock resistance of the protective sheet 20 from being maintained.

Figure 6:
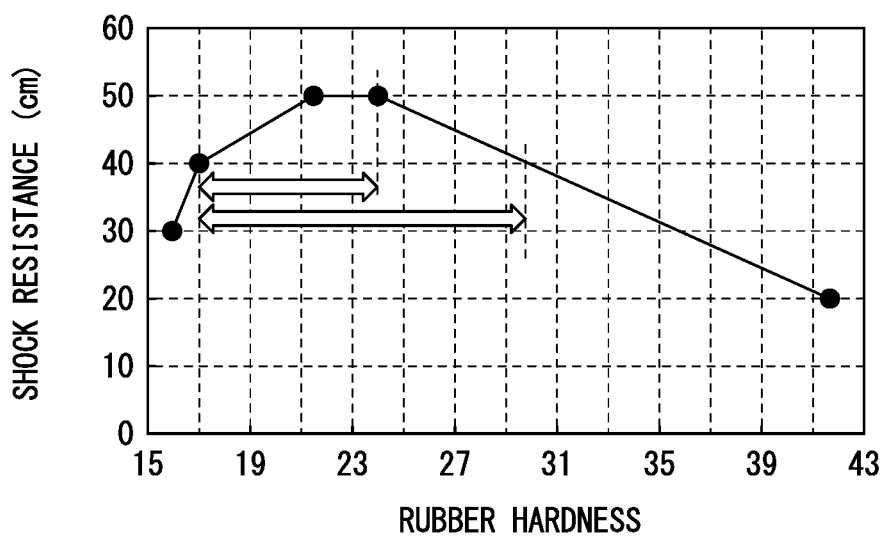
FIG. 6 is a chart illustrating an exemplary relation between the rubber hardness of a shock absorption layer and the shock resistance of a protective sheet of the display illustrated in FIG. 1.

FIG. 6 illustrates the relation between the rubber hardness and the shock resistance of the shock absorption layer 21. The shock resistance was measured in a falling ball test using a ball of 30 grams. The shock resistance is represented as the height of the ball when the display panel 10 was damaged. The rubber hardness was measured by the durometer, ASTM D 2240, type 00.

FIG. 6 demonstrates that the shock resistance of the display 1 increased as the rubber hardness of the shock absorption layer 21 increased. When the shock absorption layer 21 having a rubber hardness of 18 or greater and 24 or less was used, the shock resistance of the display 1 was substantially flat. In contrast, when the shock absorption layer 21 having a rubber hardness of 42 was used, the shock resistance decreased. Accordingly, it is appreciated that the shock absorption layer 21 having a rubber hardness of 17 or greater and 30 or less makes it possible to absorb the shock and maintain sufficient shock resistance of the display 1. It is also appreciated that, when the shock absorption layer 21 having an excessively high rubber hardness is used, the shock absorption layer 21 becomes less deformable, making it difficult to absorb the shock by the protective sheet 20. Therefore, the shock absorption layer 21 having a rubber hardness of 17 or greater and 30 or less maintains the shock resistance of the protective sheet 20 more effectively. Note that a higher shock resistance of the protective sheet 20 may be achieved by the shock absorption layer 21 having a rubber hardness of 17 or greater and 24 or less, for example.

According to the foregoing example embodiment, the shock absorption layer 21 has a storage modulus of 10 kPa or greater and 1 MPa or less at the room temperature. This reduces the stress applied to the display panel 10 when the display 1 is folded. Accordingly, it is possible to suppress a decrease in flexibility.

Further, the shock absorption layer 21 may have a rubber hardness of 17 or greater and 30 or less. This maintains the shock resistance of the protective sheet 20 more effectively.

Hereinafter, a modification example of the foregoing example embodiment is described. In the following description, components the same as those in the foregoing example embodiment are denoted by the same reference numerals, and detailed description on the components are omitted.

2. Modification Example

Figure 7:
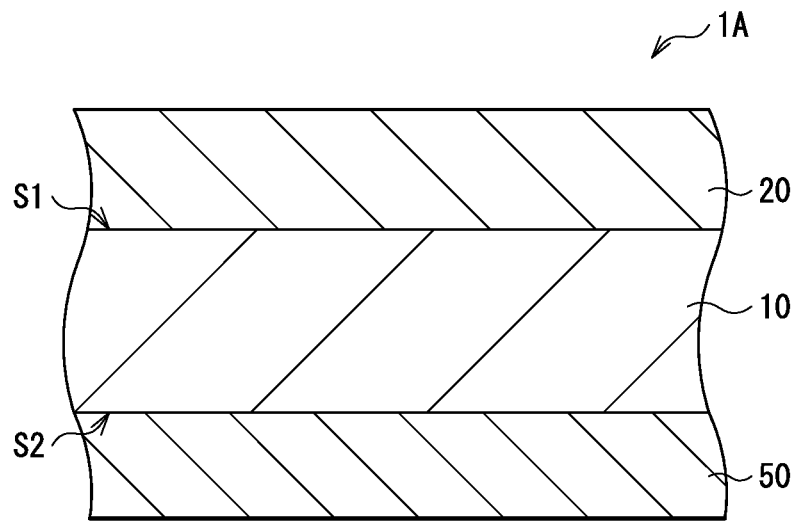
FIG. 7 is a schematic cross-sectional view of a display according to a modification example of the technology.

FIG. 7 illustrates an exemplary cross-sectional configuration of a display 1A according to a modification example of the foregoing example embodiment. The display 1A may include a protective member 50 provided on the second surface S2 of the display panel 10. The display 1A according to the modification example may have the same configuration as the display 1 according to the foregoing example embodiment except the protective member 50, and may have the same workings and effects as the display 1 according to the foregoing example embodiment.

The protective member 50 may be provided opposite to the protective sheet 20 across the display panel 10. The protective member 50 may protect the second surface S2 of the display panel 10, for example. The protective member 50 may have a plate shape, for example. Using the protective member 50 increases the stiffness of the display 1A and suppresses generation of a local deformation of the display panel 10 upon application of a shock to the display panel 10.

The protective member 50 may include a material having a relatively high Young's modulus and less plastically deformable, for example. Specific but non-limiting examples of such a material of the protective member 50 may include metal materials such as 42 alloy (42 Ni—Fe), stainless steel (SUS), magnesium (Mg) alloy, and aluminum (Al). Using the protective member 50 including such a metal material makes it possible to efficiently dissipate heat through the second surface S2 of the display panel 10. Alternatively, the protective member 50 may include a resin material, such as polyethylene terephthalate (PET). The protective member 50 may have stiffness substantially the same as that of the protective sheet 20.

3. First Application Example

One application example of the display 1 according to the foregoing example embodiment or the display 1A according to the modification example to an electronic apparatus will now be described.

First, an exemplary configuration of the display 1 or 1A is described with reference to the block diagram of FIG. 8.

[Exemplary Configuration of Display 1 or 1A]

Figure 8:
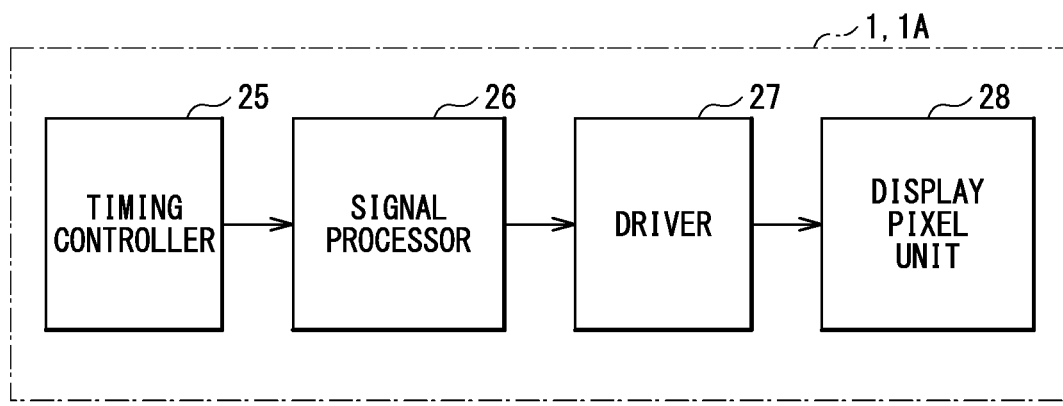
FIG. 8 is a block diagram illustrating an exemplary schematic configuration of the display illustrated in FIG. 1 and the other drawings.

FIG. 8 is a block diagram schematically illustrating an exemplary configuration of the display 1 or 1A. The display 1 or 1A may display images based on signals generated inside the display 1 or 1A or signals received from an external device. For example, the display 1 or 1A may be applied to a liquid crystal display as well as the organic EL display described above. The display 1 or 1A may include a timing controller 25, a signal processor 26, a driver 27, and a display pixel unit 28, for example.

The timing controller 25 may include a timing generator that generates various timing signals or control signals. The timing controller 25 may drive the signal processor 26 and other components on the basis of the various timing signals.

The signal processor 26 may perform predetermined correction on digital image signals received from an external device, for example, and may output the resultant image signals to the driver 27.

The driver 27 may include a scanning-line drive circuit and a signal-line drive circuit, for example. The driver 27 may drive the pixels in the display pixel unit 28 via various control lines.

The display pixel unit 28 may include display elements such as organic electroluminescent elements or liquid crystal display elements (e.g., the display element layer 13 described above) and pixel circuits that drives the respective display elements.

4. Second Application Example

[Exemplary Configuration of Electronic Apparatus]

The display 1 according to the foregoing example embodiment and the display 1A according to the modification example may be applied to various electronic apparatuses.

Figure 9:
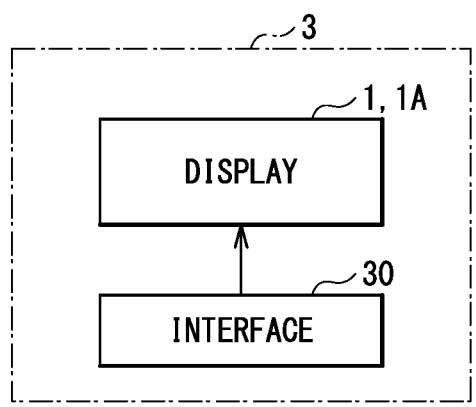
FIG. 9 is a block diagram illustrating an exemplary schematic configuration of an electronic apparatus including the display illustrated in FIG. 8.

FIG. 9 is a block diagram illustrating an exemplary configuration of an electronic apparatus 3 including the display 1 or 1A illustrated in FIG. 8. Specific but non-limiting examples of the electronic apparatus 3 may include a television unit, a personal computer (PC), a smartphone, a tablet PC, a mobile phone, a digital still camera, and a digital video camera.

The electronic apparatus 3 may include the display 1 or 1A described above and an interface 30. The interface 30 may be an input unit that receives various signals and electric power from external devices. The interface 30 may include a user interface, such as a touch screen, a keyboard, or operation buttons.

Some example embodiments, modification examples, and application examples of the technology are described above. Note that these are non-limiting examples and various modifications may be made.

For example, the material and the thickness of each layer described in the example embodiments described above are non-limiting examples, and each layer described in the example embodiments described above may include another material or may have another thickness. Further, the display according to an example embodiment of the technology does not necessarily include all of the layers described above, or may include layers other than those described above.

In the foregoing example embodiments, the display element layer 13 may include the organic electroluminescent element. Alternatively, the display element layer 13 may include another display element, such as a liquid crystal display element.

In the foregoing example embodiments, the protective sheet 20 may include the single shock absorption layer 21, the single strain relaxation layer 22, and the single shock dispersion layer 23. In another example embodiment, the protective sheet 20 may include a plurality of shock absorption layers 21, a plurality of strain relaxation layers 22, and a plurality of shock dispersion layers 23.

It should be appreciated that the effects described herein are mere examples. Effects of the example embodiments, modification examples, and application examples of the technology are not limited to those described herein, and may be different from those described herein. The technology may further include any effects other than those described herein.

It is possible to achieve at least the following configurations by the foregoing example embodiments of the technology.

(1) A display including:
  a display panel;
  a shock dispersion layer provided on a light-extraction side of the display panel and having a Young's modulus of 50 GPa or greater;
  a strain relaxation layer provided between the shock dispersion layer and the display panel and having a Young's modulus lower than the Young's modulus of the shock dispersion layer; and
  a shock absorption layer provided between the strain relaxation layer and the display panel and having a storage modulus of 10 kPa or greater and 1 MPa or less at a room temperature.

(2) A display including:
a display panel;
a shock dispersion layer provided on a light-extraction side of the display panel and having a Young's modulus of 50 GPa or greater;
a strain relaxation layer provided between the shock dispersion layer and the display panel and having a Young's modulus lower than the Young's modulus of the shock dispersion layer;
a gel-like shock absorption layer provided between the strain relaxation layer and the display panel; and
a first minimum-strain face provided in the display panel and at which a strain generated when the display is folded is minimum.

(3) The display according to (2), further including a second minimum-strain face provided in the shock dispersion layer and at which the strain generated when the display is folded is minimum.

(4) The display according to any one of (1) to (3), in which the shock absorption layer has a rubber hardness of 17 or greater and 30 or less.

(5) The display according to any one of (1) to (4), in which the shock absorption layer has a rubber hardness of 17 or greater and 24 or less.

(6) The display according to any one of (1) to (5), in which the strain relaxation layer has a Young's modulus of 1 GPa or greater and 10 GPa or less.

(7) The display according to any one of (1) to (6), in which the display panel has flexibility.

(8) The display according to any one of (1) to (7), in which the display panel includes an organic electroluminescent element.

(9) The display according to any one of (1) to (8), further including a protective member provided opposite to the shock dispersion layer across the display panel.

(10) The display according to any one of (1) to (9), in which the shock dispersion layer includes a reinforced glass.

(11) The display according to any one of (1) to (10), in which the strain relaxation layer includes a resin.

(12) The display according to any one of (1) to (11), in which the shock absorption layer has a storage modulus of 100 kPa or less at the room temperature.

(13) An electronic apparatus including a display, the display including:
a display panel;
a shock dispersion layer provided on a light-extraction side of the display panel and having a Young's modulus of 50 GPa or greater;
a strain relaxation layer provided between the shock dispersion layer and the display panel and having a Young's modulus lower than the Young's modulus of the shock dispersion layer; and
a shock absorption layer provided between the strain relaxation layer and the display panel and having a storage modulus of 10 kPa or greater and 1 MPa or less at a room temperature.

(14) An electronic apparatus including a display, the display including:
a display panel;
a shock dispersion layer provided on a light-extraction side of the display panel and having a Young's modulus of 50 GPa or greater;
a strain relaxation layer provided between the shock dispersion layer and the display panel and having a Young's modulus lower than the Young's modulus of the shock dispersion layer;
a gel-like shock absorption layer provided between the strain relaxation layer and the display panel; and
a first minimum-strain face provided in the display panel and at which a strain generated when the display is folded is minimum.

According to the display and the electronic apparatus according to one example embodiment of the technology, the shock absorption layer has a storage modulus of 10 kPa or greater and 1 MPa or less at the room temperature. This facilitates formation of the minimum-strain face—at which the strain generated when the display is folded is minimum—in the display panel.

According to the display and the electronic apparatus according to one example embodiment of the technology, the first minimum-strain face—at which the strain generated when the display is folded is minimum—may be provided in the display panel. This reduces the stress applied to the display panel when the display is folded.

According to the display and the electronic apparatus according to one example embodiment of the technology, the shock absorption layer has a storage modulus of 10 kPa or greater and 1 MPa or less at the room temperature. Further, the display and the electronic apparatus according to one example embodiment of the technology, the first minimum-strain face—at which the strain generated when the display is folded is minimum—may be provided in the display panel. This reduces the stress applied to the display panel when the display is folded. Accordingly, it is possible to suppress a decrease in flexibility.

Although the technology is described hereinabove in terms of example embodiments, modification examples, and application examples, it is not limited thereto. It should be appreciated that variations may be made in the described example embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this technology, the use of the terms first, second, etc. do not denote any order or importance, but rather the terms first, second, etc. are used to distinguish one element from another. The term "disposed on/provided on/formed on" and its variants as used herein refer to elements disposed directly in contact with each other or indirectly by having intervening structures therebetween. Moreover, no element or component in this technology is intended to be dedicated to the public regardless of whether the element or component is explicitly recited in the following claims.

What is claimed is:

1. A display comprising:
a display panel;
a shock dispersion layer provided on a light-extraction side of the display panel and having a Young's modulus of 50 GPa or greater;
a strain relaxation layer provided between the shock dispersion layer and the display panel and having a Young's modulus lower than the Young's modulus of the shock dispersion layer;
a shock absorption layer provided between the strain relaxation layer and the display panel and having a storage modulus of 10 kPa or greater and 1 MPa or less at a room temperature;
a first minimum-strain face provided in the display panel and at which a strain generated when the display is folded is minimum, and a second minimum-strain face provided in the shock dispersion layer and at which the strain generated when the display is folded is minimum.

2. A display comprising:

a display panel;

a shock dispersion layer provided on a light-extraction side of the display panel and having a Young's modulus of 50 GPa or greater;

a strain relaxation layer provided between the shock dispersion layer and the display panel and having a Young's modulus lower than the Young's modulus of the shock dispersion layer;

a gel-like shock absorption layer provided between the strain relaxation layer and the display panel; and a first minimum-strain face provided in the display panel and at which a strain generated when the display is folded is minimum.

3. The display according to claim 2, further comprising a second minimum-strain face provided in the shock dispersion layer and at which the strain generated when the display is folded is minimum.

4. The display according to claim 1, wherein the shock absorption layer has a rubber hardness of 17 or greater and 30 or less.

5. The display according to claim 1, wherein the shock absorption layer has a rubber hardness of 17 or greater and 24 or less.

6. The display according to claim 1, wherein the strain relaxation layer has a Young's modulus of 1 GPa or greater and 10 GPa or less.

7. The display according to claim 1, wherein the display panel has flexibility.

8. The display according to claim 1, wherein the display panel includes an organic electroluminescent element.

9. The display according to claim 1, further comprising a protective member provided opposite to the shock dispersion layer across the display panel.

10. The display according to claim 1, wherein the shock dispersion layer includes a reinforced glass.

11. The display according to claim 1, wherein the strain relaxation layer includes a resin.

12. The display according to claim 1, wherein the shock absorption layer has a storage modulus of 100 kPa or less at the room temperature.

13. An electronic apparatus comprising a display, the display including:

a display panel;

a shock dispersion layer provided on a light-extraction side of the display panel and having a Young's modulus of 50 GPa or greater;

a strain relaxation layer provided between the shock dispersion layer and the display panel and having a Young's modulus lower than the Young's modulus of the shock dispersion layer;

a shock absorption layer provided between the strain relaxation layer and the display panel and having a storage modulus of 10 kPa or greater and 1 MPa or less at a room temperature;

a first minimum-strain face provided in the display panel and at which a strain generated when the display is folded is minimum, and a second minimum-strain face provided in the shock dispersion layer and at which the strain generated when the display is folded is minimum.

14. An electronic apparatus comprising the display according to claim 2.

* * * * *